US009575145B2

(12) United States Patent
Culver et al.

(10) Patent No.: US 9,575,145 B2
(45) Date of Patent: Feb. 21, 2017

(54) EXPANDED FOAM FORMER APPARATUS AND METHOD FOR MAKING THE SAME

(71) Applicant: General Electric Company, Schenectady, NY (US)

(72) Inventors: Craig William Culver, Neosho, WI (US); John Edward Lorbiecki, Waukesha, WI (US); Michael James Calloway, Waukesha, WI (US); Sahil Bhatia, Streetsboro, OH (US); Tae Young Yang, Streetsboro, OH (US); YunJeong Stickle, Solon, OH (US); Tom Zink, North Royalton, OH (US); Darren Gregan, Auburn, OH (US)

(73) Assignee: GENERAL ELECTRIC CORPORATION, Schenectady, NY (US)

( * ) Notice: Subject to any disclaimer, the term of this patent is extended or adjusted under 35 U.S.C. 154(b) by 647 days.

(21) Appl. No.: 14/067,183

(22) Filed: Oct. 30, 2013

(65) Prior Publication Data
US 2015/0115962 A1  Apr. 30, 2015

(51) Int. Cl.
*G01R 33/34* (2006.01)
*G01R 33/48* (2006.01)

(52) U.S. Cl.
CPC ... *G01R 33/34084* (2013.01); *G01R 33/34046* (2013.01); *G01R 33/4808* (2013.01); *Y10T 29/49071* (2015.01)

(58) Field of Classification Search
CPC .............. G01R 33/34084; G01R 33/34046; G01R 33/4808
See application file for complete search history.

(56) References Cited

U.S. PATENT DOCUMENTS

| | | | |
|---|---|---|---|
| 6,900,635 B1 | 5/2005 | Petropoulos et al. | |
| 7,084,631 B2 | 8/2006 | Qu et al. | |
| 7,245,127 B2 | 7/2007 | Feng et al. | |
| 7,526,330 B1* | 4/2009 | Randell | A61B 5/055 324/309 |
| 8,046,046 B2 | 10/2011 | Chan et al. | |
| 2012/0161767 A1* | 6/2012 | Hardy | H04B 5/0093 324/318 |
| 2012/0161768 A1* | 6/2012 | Hardy | G01R 33/3642 324/318 |
| 2013/0137969 A1* | 5/2013 | Jones | A61B 5/055 600/421 |
| 2013/0320981 A1* | 12/2013 | Bulumulla | G01R 33/34084 324/318 |

* cited by examiner

*Primary Examiner* — Rodney Bonnette
(74) *Attorney, Agent, or Firm* — Grogan, Tuccillo & Vanderleeden, LLP

(57) ABSTRACT

An MR coil former apparatus includes a body, a coil array, and a coil cover. The body defines a patient-facing positive surface opposite a non-patient-facing negative surface. The positive surface of the body includes an anatomic contour, and the coil array is disposed adjacent and conformed to the anatomic contour. The coil cover is disposed overlying the coil array and conformed to the anatomic contour.

19 Claims, 7 Drawing Sheets

EXPANDED FOAM FORMER APPARATUS AND METHOD FOR MAKING THE SAME

BACKGROUND

Technical Field

Embodiments of the invention relate generally to enhancing quality of images obtained from MR scanners, including PET-MR scanners. Particular embodiments relate to formers used for positioning MR coils adjacent patient anatomy.

Discussion of Art

Magnetic resonance imaging ("MR") uses RF antenna coils to detect rotating ("relaxation") magnetic fields that are produced by nuclei that have odd atomic numbers, i.e., total number of neutrons and protons is not divisible by two, in response to alternately imposing and removing a scanning exciting magnetic field. Typically, MR is accomplished by imposing on a target material a strong (e.g., 1.5, 3 or 7 Tesla) constant magnetic field ("alignment field") that spin-aligns nuclei of atoms within the target material. In order to obtain the relaxation magnetic field, an exciting field that fluctuates at radio frequencies (e.g., anywhere from about 64 MHz to about 900 MHz, typically at 1.5 T) is superimposed over the alignment field.

MR is frequently used for differentiating tissue types within a patient, and is also used for identifying fine detail structures. Typically, different pulse sequences are used for tissue differentiation. For example, a T1 pulse sequence can be used to obtain images with water appearing darker and fat brighter. On the other hand, a T2 pulse sequence can be used to obtain an image with fat darker, and water lighter.

One advantage of MR is that magnetic fields do not attenuate in body tissues, so that nucleus location can be determined (using Fourier analysis) based solely on frequency shifting between the imposed magnetic field and the response field. Another advantage is that by careful selection of pulse sequence, distinct tissues or materials can be highlighted.

For enhanced MR imaging, the detector coils typically are disposed as close as possible to the tissues being imaged. Typically, a "former" is provided both for positioning the detector coils and for positioning a patient within the MR field. Formers conventionally have been made of non-ferromagnetic materials that do not interfere with or mimic the MR response of patient tissues, and that exhibit high rigidity in a thin section (e.g., injection-molded polycarbonate or polyurethane). Such materials typically have been formed into a hollow shell, with the detector coils supported by the negative (non-patient-facing) surfaces of the former, inside the shell, and connected with ancillary circuitry housed within the shell. By locating the detector coils at the negative surface, it is possible to provide maximal room for assembly of detector coils and ancillary circuitry, enhance patient comfort, and avoid mechanical design complications associated with through-holes in the former surface. provide a flame barrier, Additionally, detector coils frequently couple and dissipate relatively large electrical power—often in excess of 15 W. By anchoring the detector coils at the "negative" (non-patient-facing) surface of the former, the former itself can then provides a flame barrier rated "V2" or higher (per UL standard 94) between the patient and the high-power detector coils. For example, a former may be fabricated to include greater than about 1.1 mm thickness of "Lexane 940"™ polycarbonate.

Although the conventional "shell" formers do provide maximal volume for ancillary circuitry, and facilitate connection of the detector coils to the circuitry, actually arranging and attaching the detector coils onto the negative surfaces has been identified as a manufacturing challenge. Partly because permanent adhesives are used for secure positioning, the negative surface coil arrays also are hard to repair. Nonetheless, many factors inform the conventional approach to building internal or negative-surface coil arrays.

MR can be combined with positron emission tomography (PET) within a single apparatus (a "PET-MR scanner"). Such scanners use one or more rings of scintillators or other detectors to generate electrical signals from gamma rays (photon pairs) that are produced from the recombination of electrons, within a target material, and positrons, emitted from decay of a radionuclide packaged in a tracer compound. Typically, recombination events occur within about 1 mm from the radionuclide decay event, and the recombination photons are emitted in opposite directions to arrive at different detectors. Paired photon arrivals that occur within a detection window (usually less than a few nanoseconds apart) are counted as indicating a recombination event, and, on this basis, computed tomography algorithms are applied to the scintillator position and detection data in order to locate the various recombination events, thereby producing three-dimensional images of the tracer disposition within the target material.

Typically, the target material is body tissue, the tracer compound is a liquid analogue to a biologic fluid, and the radionuclide is disposed primarily in body tissues that make use of the biologic fluid. For example, a common form of PET makes use of fludeoxyglucose (18F), which is analogous to glucose with the 18F radionuclide substituted for one of the hydroxyl groups ordinarily composing glucose. Fludeoxyglucose is preferentially absorbed by brain matter, by the kidneys, and by growing cells (e.g., metastasizing cancer cells). Thus, PET is frequently used for oncologic studies, for localizing particular organs, and for studying metabolic processes.

PET signal attenuation is very specific to patient anatomy and material properties. In particular, the dense and rigid polymers typically used in MR formers (e.g., polycarbonate, polyurethane) can significantly attenuate the gamma rays generated by positron recombination events. For example, a conventional head/neck coil former built from polycarbonate may attenuate PET sensitivity by as much as about 21 percent. Moreover, dense polymers tend to be absorptive of positrons, producing noisy recombinations that can obscure PET imaging of body tissues. However, given the conventional preference for negative surface coil and circuit assemblies, polycarbonate, polyurethane, and similar high-density, high-rigidity polymers have been seen as the typical materials for building coil formers.

One factor particularly promoting the retention of high-density polymers has been that lower-density materials would require increased shell wall thicknesses, thereby displacing coils from the patient and diminishing MR signal/noise ratio (SNR). Diminished SNR would require longer MR scan times, which detracts from a general goal of increasing scanner utilization. Thus, conventional designs and material choices for coil formers have presented a dilemma of optimizing either for PET or for MR imagery. One option has been to provide additional openings through the light structure of non-weight-bearing (anterior) formers. For example, anterior HNU formers in PET-MR environment may have additional holes to allow positrons to pass, but providing more openings is a technique that has only been used on non-supporting formers that are anterior to the patient. As PET relies upon near-simultaneous detection of two photons at opposite sides of a scintillator ring, having the additional holes only at the anterior side renders this option ineffective for actually enhancing the PET signal.

BRIEF DESCRIPTION

In embodiments of the invention, an MR coil former apparatus comprises a body, a coil array, and a coil cover. The body defines a patient-facing positive surface opposite a non-patient-facing negative surface. The positive surface of the body includes an anatomic contour, and the coil array is disposed adjacent and conformed to the anatomic contour. The coil cover is disposed overlying the coil array and conformed to the anatomic contour.

In certain aspects, the invention provides a method for making a PET-compatible MR coil former. The method comprises fabricating from an expanded foam polymer a former; applying to an anatomically contoured patient-facing surface of the former an MR detector coil array; and attaching a coil cover to cover the MR detector coil array.

In other embodiments, an MR coil former apparatus comprises a body, which defines a patient-facing positive surface opposite a non-patient-facing negative surface, the positive surface including an anatomic contour; a coil array, which is disposed at the anatomic contour of the positive surface; and a coil cover disposed to cover the coil array. The coil cover has a flame barrier rating of at least V0 per UL 94.

DRAWINGS

The present invention will be better understood from reading the following description of non-limiting embodiments, with reference to the attached drawings, wherein below:

DETAILED DESCRIPTION

Figure 1:
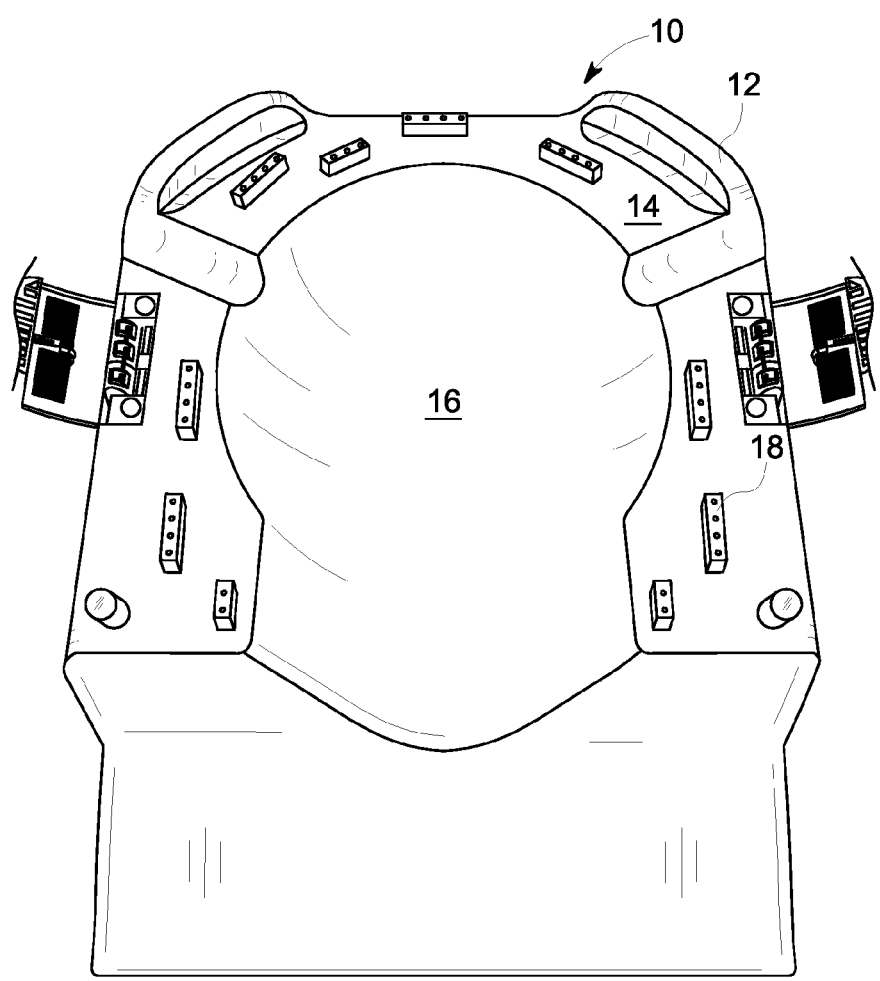
FIG. 1 shows a "positive" (patient-facing) surface of a conventional MR coil former.

Reference will be made below in detail to exemplary embodiments of the invention, examples of which are illustrated in the accompanying drawings. Wherever possible, the same reference characters used throughout the drawings refer to the same or like parts, without duplicative description. Exemplary embodiments of the present invention are described with respect to combined PET-MR scanners. Aspects of the invention relate to improving the simultaneous collection of PET and MR images.

Referring to FIG. 1, a conventional head and neck unit ("HNU") posterior former 10 is configured to support the back of a supine patient's head. The conventional posterior former 10 has a rigid body 12 that is injection molded from polycarbonate or polyurethane stock material. The body 12 typically is about 4 mm thick. (As used herein, the terms "substantially," "generally," and "about" indicate conditions within reasonably achievable manufacturing and assembly tolerances, relative to ideal desired conditions suitable for achieving the functional purpose of a component or assembly.)

In particular, the body 12 is shown from its "positive" or patient-facing surface 14, which defines an anatomic contour 16 that is provided for receiving the back of the patient's head. The body 12 also includes a number of electrical connectors 18 that are arrayed around the periphery of the anatomic contour 16. The electrical connectors 18 are exposed above the patient-facing surface 14 for connection with matching connectors of a matching anterior mask (not shown).

Figure 2:
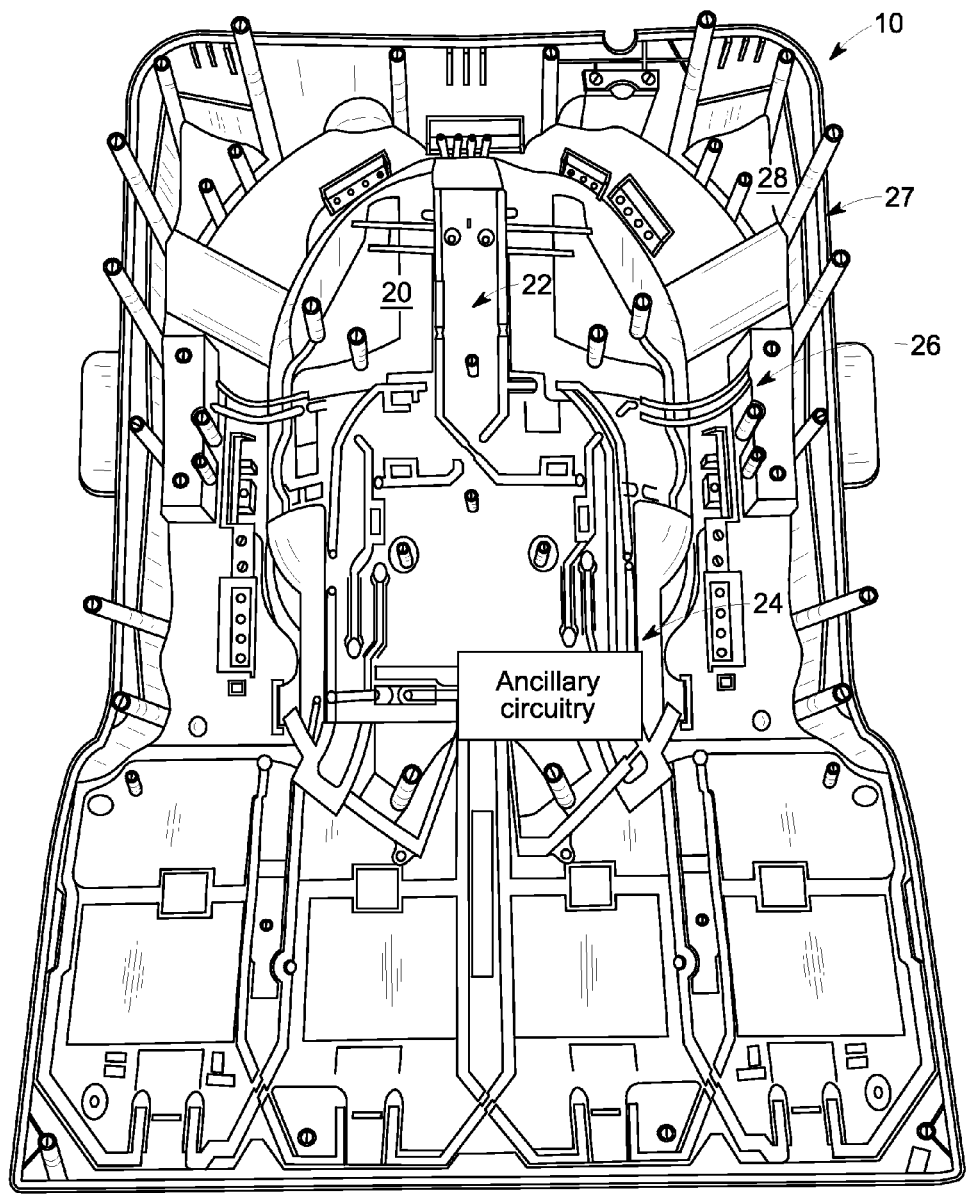
FIG. 2 shows a "negative" (non-patient-facing) surface of the coil former shown in FIG. 1.

FIG. 2 shows the conventional HNU former 10 from its non-patient-facing ("negative") surface 20, on which an MR detector coil array 22 is mounted, along with ancillary circuitry 24. The ancillary circuitry 24 includes the electrical connectors 18, as well as a cable for connection to an MR system processor. The negative surface 20 extends into walls 27 that define a void 28 for housing the ancillary circuitry and any additional components associated with the ancillary circuitry. A "void," generally, is a volume of space at least partly enclosed or defined by a surrounding structure such as, for example, walls, bars, or a cage.

Figure 3:
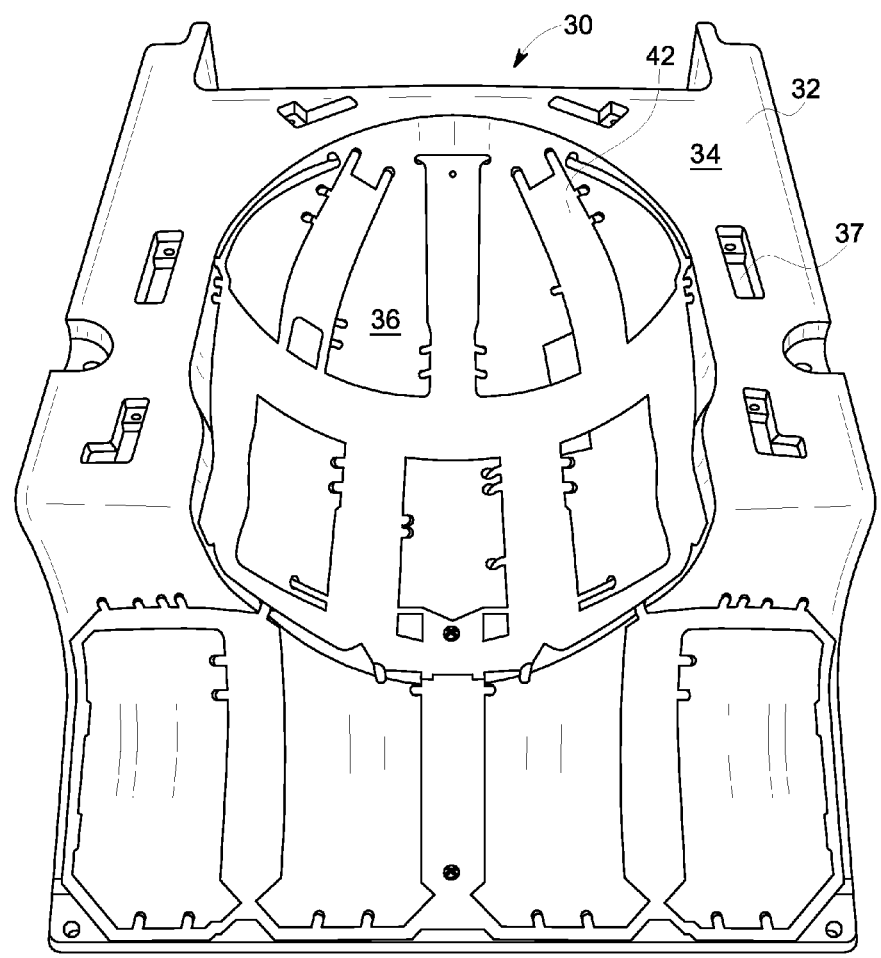
FIG. 3 shows a positive surface of a lightweight expanded foam former, according to a first embodiment of the invention.

Turning now to FIG. 3, a lightweight HNU former 30, according to an exemplary embodiment of the invention, is depicted. The former 30 is shown from a positive surface 34 of its body 32. According to aspects of the present invention, the body 32 is formed of one or more low-density polymers having a high-rigidity microstructure, for example, expanded polypropylene beads (EPP) that have been molded and heat formed. In certain embodiments, good results have been obtained using EPP with densities of 45 g/l or 80 g/l. In certain embodiments, other expanded foam plastics may be utilized, provided their properties (PET photon transmission, MR response, rigidity) are comparable to those of EPP. For example, polyurethane and polyethylene foams could potentially be utilized. In addition, other rigid foamed polymers may be suitable for adaptation in place of EPP. Desirably, such polymers might have densities of between about 20 g/l to about 90 g/l.

Figure 4:
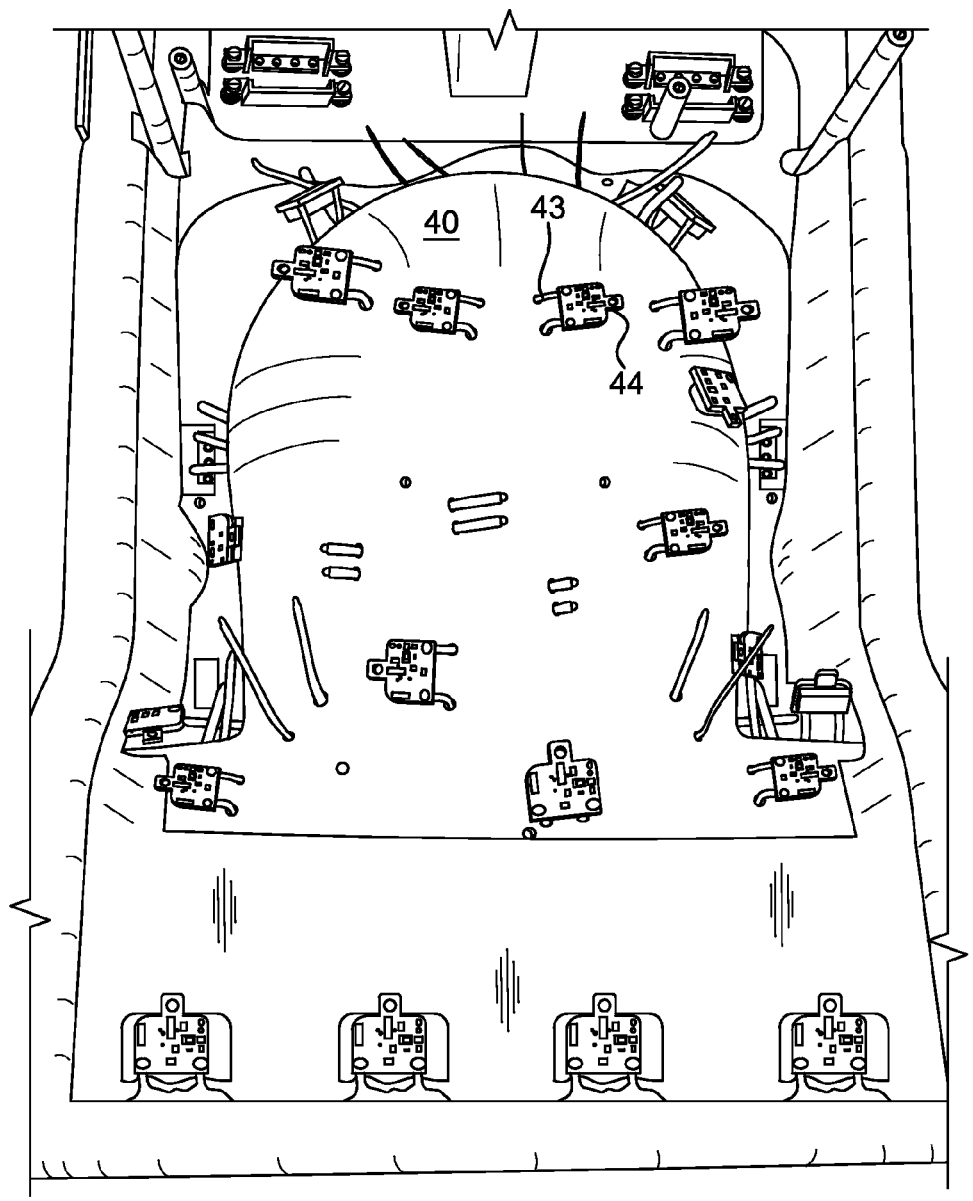
FIG. 4 shows a negative surface of the former shown in FIG. 3.

The body 32, as shown in FIGS. 3 and 4, typically is at least about 15 mm thick. The positive surface 34 of the body 32 includes an anatomic contour 36 for supporting a portion of a patient's body, e.g., a concavity for receiving the back of a patient's head. Around the periphery of the anatomic contour 36, a plurality of holes 37 are formed through the body 32 for housing electrical connectors (not shown). Within the anatomic contour 36, an MR detector coil array 42 is applied to the positive surface 34. Typically, the detector coil array 42 is adhered to the surface 34 and is conformed to the anatomic contour 36.

As will be appreciated, the body 32 includes negative surface 40 (FIG. 4). As shown, the body 32 is penetrated by leads 43 for connecting the MR detector coil array 42 with ancillary circuitry 44, which may be supported by the negative surface 40.

Figure 5:
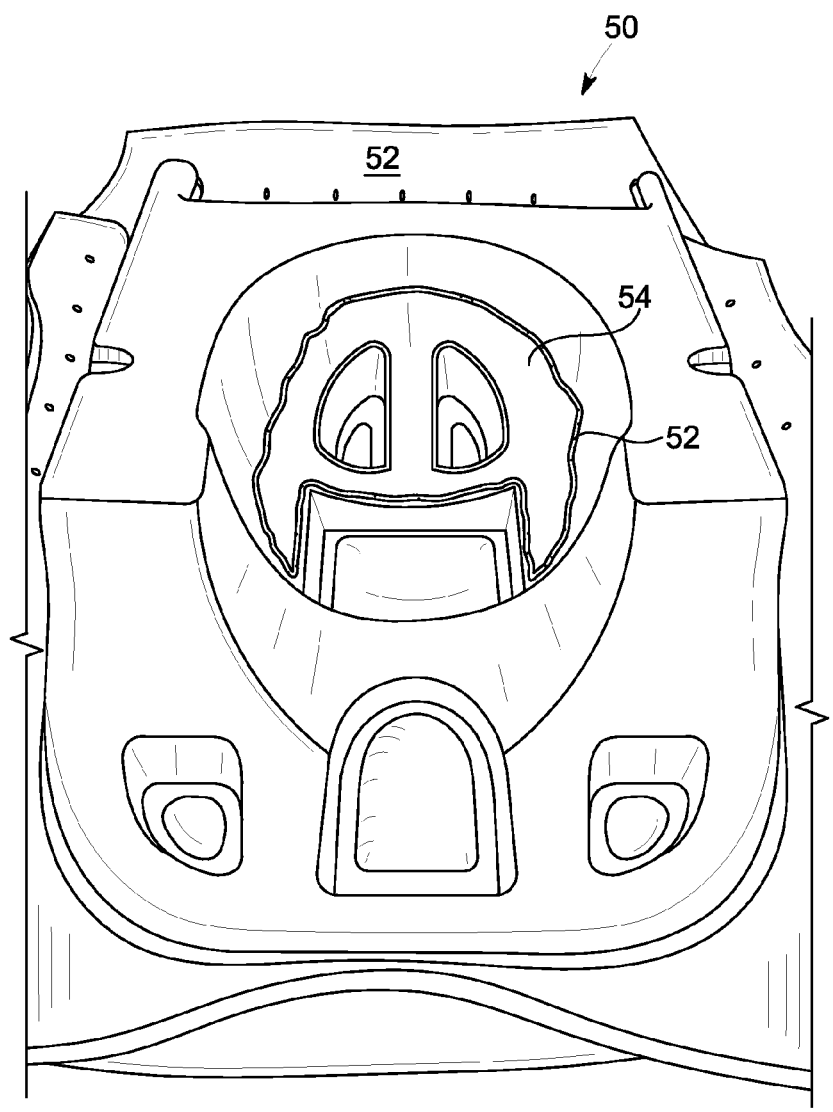
FIG. 5 shows an anterior mask configured for attachment to the former shown in FIG. 3.

Turning now to FIG. 5, an anterior mask 50 is provided for covering a patient's face while the patient's head rests on the MR former 30. In an embodiment, the anterior mask 50 includes at least one foam layer 52 that is fabricated of, e.g., foamed polyvinylidene fluoride. In certain embodiments, other low-density and comparably resilient foams, comparably transparent to MR and to PET, are suitable (e.g., polyethylene). Typically, the foam layer 52 is at least about 3 mm thick and no more than about 6 mm thick. The foam layer 52 encases an anterior MR detector coil array 54, similar to the detector coil array 42. In an embodiment, the anterior mask 50 is removably attachable to the body 32.

Figure 6:
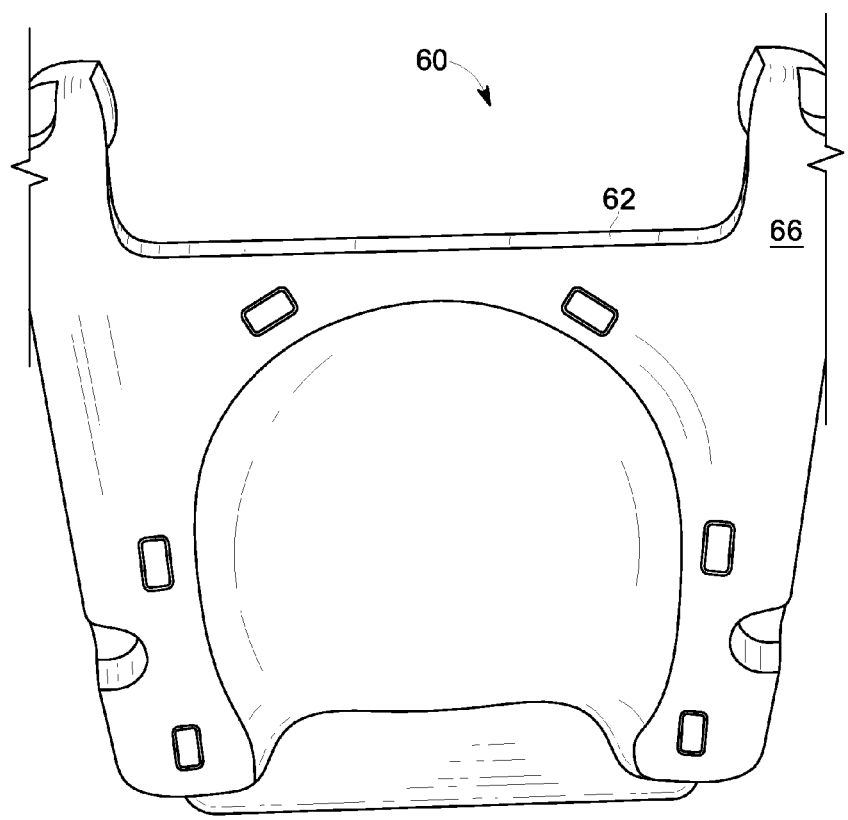
FIG. 6 shows a coil cover configured for attachment at the positive surface of the former shown in FIG. 3.

FIG. 6 depicts a coil cover 60, which is configured to cover the MR detector coil array 42 so as to present, in certain embodiments, a smooth appearance and/or a contact surface for patient comfort. In certain embodiments, the coil cover 60 becomes permanently attached to the former body 32; in other embodiments, the coil cover 60 is removably attached to the former body 32. In embodiments of the invention, with the detector coil array 42 at the positive side of the former body 32, flame resistance is an aspect of the coil cover 60, which provides a flame barrier of at least V2 rating (per UL 94) between the coil array 42 and a patient supported on the former 30. In certain embodiments, the coil cover 60 provides a flame barrier of at least V0 rating (per UL 94) between the coil array 42 and the patient. For example, in certain embodiments the coil cover 60 includes a resilient foam layer 62 overlaid by a patient-contacting layer 66. The resilient foam layer 62 can be fabricated from polyvinylidene fluoride foam, for example, Zotec brand composition number F30. Other flame retardant foams (e.g., polyethylene) may also be usable. In certain embodiments, the resilient foam layer 62 may be between about 1 mm to about 5 mm thickness. The patient-contacting layer 66, in some embodiments, is fabricated as a polyethylene foil or film. "Foil," as used herein, refers to a structure of substantially uniform thickness, sufficiently rigid to hold a three-dimensional shape under its own weight without external support. "Film" as used herein, refers to a structure of lesser rigidity than a foil, requiring external supports to retain a three-dimensional shape. However, other materials and structures (e.g., vinyl, nylon, or polyester films, foils, or woven or non-woven fabrics) may be suitable. In certain embodiments, the patient-contacting layer 66 may be between about 1 mm and about 2 mm thickness. Typically, the coil cover 60 has a total thickness of between about 5 mm and about 8 mm, and is conformed to the anatomic contour 36.

Figure 7:
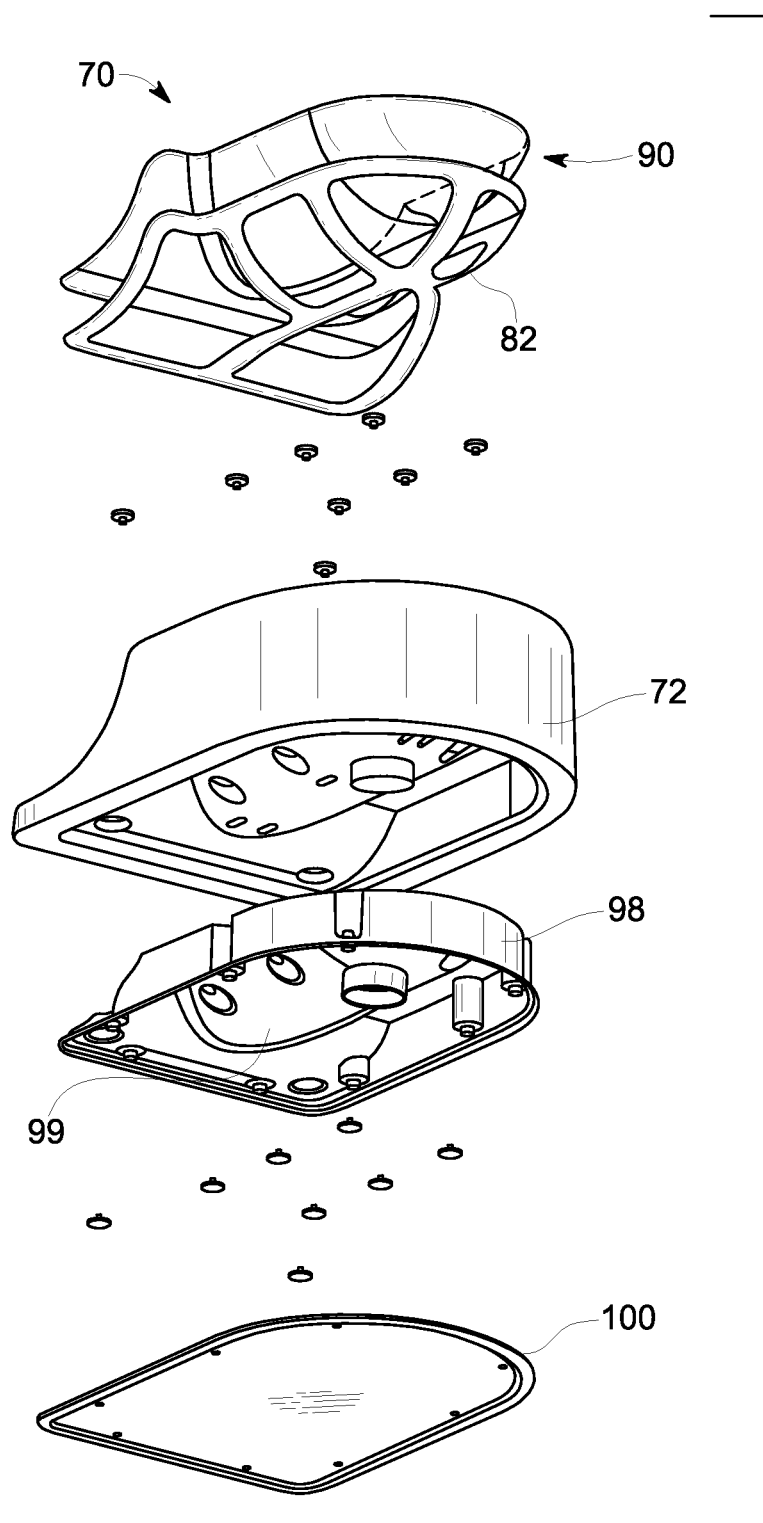
FIG. 7 shows an exploded assembly of a mid-weight expanded foam former, according to a second embodiment of the invention.

FIG. 7 illustrates an exploded assembly view of a mid-weight NU former 70 according to another embodiment of the present invention. The former 70 includes a body 72 formed of EPP or similar rigid foam having comparable properties; an MR detector coil array 82; and a foil form 90. The foil form 90 serves as a construction surface for the MR detector coil array 82, which is adhered to it during assembly. The foil form 90 also serves as a coil cover and flame barrier of the mid-weight NU former 70. The mid-weight HNU former 70 also may include a tray 98, which can be fabricated from polycarbonate, polyurethane, or other dense and rigid polymer. In the mid-weight HNU former 70, the tray 98 underlies and supports the rigid foam body 72 to permit reduced thickness of the foam shell; and, also, provides a flame barrier between the detector coil array 82 and a void 99, within which ancillary circuitry (not shown) can be assembled and anchored to the rigid tray. Thickness of the tray 98 is minimal to mitigate PET photon noise or absorption; indeed, the tray 98 can be omitted for some PET-MR products. Typically, the tray 98 is between about 0.7 mm to about 1.5 mm thick, while the body 72 is between about 1 to 10 mm thick. The mid-weight NU former 70 also includes a cover 100 that can be fastened to the tray 98 in order to enclose the ancillary circuitry within the void 99.

Thus, embodiments of the invention provide an MR coil former apparatus, which comprises a body, a coil array, and a coil cover. The body defines a patient-facing positive surface opposite a non-patient-facing negative surface. The positive surface of the body includes an anatomic contour, and the coil array is disposed adjacent and conformed to the anatomic contour. The coil cover is disposed overlying the coil array and conformed to the anatomic contour. Certain embodiments also comprise ancillary circuitry, which is supported from the negative surface and electrically connected with the coil array. In some embodiments, the coil array is adhered to the anatomic contour. In some embodiments, the coil cover comprises a foamed polymer layer. In some embodiments, the foamed polymer layer consists essentially of at least one of the group consisting of polyvinylidene fluoride and polyethylene. In some embodiments, the foamed polymer layer is between about 1 mm and about 8 mm thickness. In some embodiments, the foamed polymer layer is about 5 mm thickness. In some embodiments, the coil cover comprises a patient-contacting foil overlaying the foamed polymer layer. In some embodiments, the foil is between about 1 mm and about 2 mm thickness. In some embodiments, the coil cover has a total thickness of between about 5 mm and about 8 mm. In some embodiments, the coil cover has a flame barrier rating of at least V2 per UL 94. In some embodiments, the body consists essentially of an expanded foam polymer shell of at least about 15 mm thickness. In some embodiments, the expanded foam polymer is selected from a group consisting of polypropylene, polyurethane, and polyethylene. Certain embodiments of the inventive former apparatus further comprise a tray disposed at and supporting the negative surface of the body. In some embodiments, the tray consists essentially of a viscid polymer selected from a group consisting of polycarbonate or polyurethane. In some embodiments, the tray thickness is between about 0.5 mm and about 1.5 mm.

In certain aspects, the invention provides a method for making a PET-compatible MR coil former. The method comprises fabricating from an expanded foam polymer a former; applying to an anatomically contoured patient-facing surface of the former an MR detector coil array; and attaching a coil cover to cover the MR detector coil array. In certain aspects, the method also comprises assembling ancillary circuitry to a negative surface of the body; and electrically connecting the MR detector coil array to the ancillary circuitry. The method also may comprise covering the ancillary circuitry with a cover also made from expanded polymer foam, and attached to the former body.

In other embodiments, an MR coil former apparatus comprises a body, which defines a patient-facing positive surface opposite a non-patient-facing negative surface, the positive surface including an anatomic contour; a coil array, which is disposed at the anatomic contour of the positive surface; and a coil cover disposed to cover the coil array. The coil cover has a flame barrier rating of at least V0 per UL 94.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An MR coil former apparatus comprising:
   a body, which defines a patient-facing positive surface opposite a non-patient-facing negative surface, the positive surface including an anatomic contour;
   a coil array, which is disposed adjacent and conformed to the anatomic contour;
   a coil cover, which is disposed overlying the coil array and conformed to the anatomic contour; and
   ancillary circuitry, which is supported from the negative surface and electrically connected with the coil array.

2. The apparatus as claimed in claim 1, wherein the coil array is adhered to the anatomic contour.

3. The apparatus as claimed in claim 1, wherein the coil cover comprises a foamed polymer layer.

4. The apparatus as claimed in claim 3, wherein the foamed polymer layer consists essentially of at least one of the group consisting of polyvinylidene fluoride and polyethylene.

5. The apparatus as claimed in claim 4, wherein the foamed polymer layer is 5 mm thickness.

6. The apparatus as claimed in claim 3, wherein the foamed polymer layer is between 1 mm and about 8 mm thickness.

7. The apparatus as claimed in claim 3, wherein the coil cover comprises a patient-contacting foil overlaying the foamed polymer layer.

8. The apparatus as claimed in claim 7, wherein the foil is between 1 mm and about 2 mm thickness.

9. The apparatus as claimed in claim 3, wherein the coil cover has a total thickness of between 5 mm and about 8 mm.

10. The apparatus as claimed in claim 3, wherein the coil cover has a flame barrier rating of at least V2 per UL 94.

11. The apparatus as claimed in claim 1, wherein the body consists essentially of an expanded foam polymer shell of at least 15 mm thickness.

12. The apparatus as claimed in claim 11, wherein the expanded foam polymer is selected from a group consisting of polypropylene, polyurethane, and polyethylene.

13. The apparatus as claimed in claim 1, further comprising a tray disposed at and supporting the negative surface of the body.

14. The apparatus as claimed in claim 13, wherein the tray consists essentially of a viscid polymer selected from a group consisting of polycarbonate or polyurethane.

15. The apparatus as claimed in claim 14, wherein the tray thickness is between 0.5 mm and about 1.5 mm.

16. A method for making a PET-compatible MR coil former, said method comprising:
   fabricating from an expanded foam polymer a former;
   applying to an anatomically contoured patient-facing surface of the former an MR detector coil array; and
   attaching a coil cover to cover the MR detector coil array.

17. The method as claimed in claim 16, further comprising:
   assembling ancillary circuitry to a negative surface of the body; and
   electrically connecting the MR detector coil array to the ancillary circuitry.

18. The method as claimed in claim 17, further comprising covering the ancillary circuitry with a cover also made from expanded polymer foam, and attached to the former body.

19. An MR coil former apparatus comprising:
   a body, which defines a patient-facing positive surface opposite a non-patient-facing negative surface, the positive surface including an anatomic contour;
   a coil array, which is disposed at the anatomic contour of the positive surface;
   a coil cover disposed to cover the coil array; and
   wherein the coil cover has a flame barrier rating of at least V0 per UL 94.

* * * * *